United States Patent [19]

Johansson et al.

[11] Patent Number: 5,587,333
[45] Date of Patent: Dec. 24, 1996

[54] CAPACITOR IN AN INTEGRATED FUNCTION BLOCK OR AN INTEGRATED CIRCUIT HAVING HIGH CAPACITANCE, A METHOD FOR MANUFACTURING SAID CAPACITOR AND UTILIZING OF SAID CAPACITOR AS AN INTEGRATED DECOUPLING CAPACITOR

[75] Inventors: Ted Johansson, Hägersten; Jose-Maria Gobbi, Stockholm, both of Sweden

[73] Assignee: Telefonaktiebolaget LM Ericsson, Stockholm, Sweden

[21] Appl. No.: 470,145

[22] Filed: Jun. 6, 1995

Related U.S. Application Data

[62] Division of Ser. No. 84,459, Jul. 1, 1993, abandoned.

[30] Foreign Application Priority Data

Jul. 6, 1992 [SE] Sweden ................... 9202093

[51] Int. Cl.[6] ............................... H01L 21/70; H01L 27/00
[52] U.S. Cl. ..................... 437/60; 437/919; 148/DIG. 14
[58] Field of Search ................................ 437/919, 60, 47; 148/DIG. 14

[56] References Cited

U.S. PATENT DOCUMENTS

| 3,619,735 | 11/1971 | Chen et al. | 317/235 |
| 4,937,649 | 6/1990 | Shiba et al. | 357/51 |

FOREIGN PATENT DOCUMENTS

| 083405 | 7/1983 | European Pat. Off. . |
| 093818 | 11/1983 | European Pat. Off. . |
| 262493 | 4/1988 | European Pat. Off. . |
| 268260 | 5/1988 | European Pat. Off. . |

Primary Examiner—H. Jey Tsai
Attorney, Agent, or Firm—Burns, Doane, Swecker & Mathis, L.L.P.

[57] ABSTRACT

A method for creating a MOS-type capacitor structure in function blocks or integrated circuits. Each block or cell is provided with capacitors for decoupling purposes under the broad metal supply lines without requiring any extra silicon surface. The buried capacitors can be designed under any broad conductor path or on a chip made of a semiconductor material.

20 Claims, 1 Drawing Sheet

CAPACITOR IN AN INTEGRATED FUNCTION BLOCK OR AN INTEGRATED CIRCUIT HAVING HIGH CAPACITANCE, A METHOD FOR MANUFACTURING SAID CAPACITOR AND UTILIZING OF SAID CAPACITOR AS AN INTEGRATED DECOUPLING CAPACITOR

This application is a divisional, of application Ser. No. 08/084,459, filed Jul. 1, 1993 now abandoned.

FIELD OF THE INVENTION

The present invention relates to a process for creating a MOS-type capacitor structure in function blocks or integrated circuits and, more particularly, a process for easily creating, for instance, a decoupling capacitor in such a structure block without the need of any extra silicon surface or any extra process step in the manufacturing by basically a standard MOS or BiCMOS technique.

BACKGROUND OF THE INVENTION

In a general electronics circuitry, no matter whether it is realized through the use of discrete components and integrated circuits (IC) on a printed broad assembly or as a tailored integrated circuit performing the entire desired function on a single integrated broad assembly, there is, for instance, a need for filtering the DC supply from fluctuations, so called dI/dt noise. The noise in the integrated circuit chip is substantially generated as digital electronic functions are interconnected or decoupled. A reduction of the noises in the high frequency range is particularly important for high frequency circuits. An excessive generation of noise increases the requirements on the noise margin and other circuit parameters.

The closer the decoupling capacitors can be placed in relation to the noise source, i.e., for instance, the switching transistors, the more effective the decoupling will be, primarily due to a decreased inductance in series with the decoupling capacitance. On a broad assembly, the decoupling capacitors must be placed closest to the noise generating IC-circuits, and a direct placing of decoupling capacitors on the integrated circuit chip is, of course, even better, since the decoupling is performed as close to the noise source as possible and powerful noise from RLC links through the bondings and the bonding wires will be suppressed and thus avoided. Due to the extremely low inductance in the power distribution lines on the chip itself, the decoupling capacitors on the chip also improve the frequency characteristics for the decoupling. It is, however, a problem that such an integrated capacitor normally requires a silicon surface, that can become relatively expensive to obtain a suitable capacitance value for the integrated capacitor.

U.S. Pat. No. 3,619,735 discloses a process and an integrated circuit, where a decoupling capacitor is provided underneath devices at the surface of an integrated circuit by creating a first epitaxial layer between an $N^+$ substrate, which has a $P^+$ zone diffused into it, and an epitaxial layer containing a $N^+$ device, a $P^+$ channel diffusion to the $P^+$ zone formed in the substrate further serving as an attenuating resistor in combination with the coupling capacitance. The process does, however, require extra process steps in the manufacturing thereof.

Decoupling capacitors can also be created by distribution of capacitors in a carrier of the chip in an integrated circuit, which has been disclosed for example in EP-A2-0 262 493 and EP-A1-0 268 260, or in an LSI circuit, as in EP-A2-0 083 405. Thus, this means among other things that special steps must be performed in the manufacturing of the integrated circuit chip.

The method of designing application specific integrated circuits, so called ASIC (Application Specific Integrated Circuit), consists in using predefined building blocks or standard cells from a library. The integration of decoupling capacitors in each such block or such cell constitutes the most effective decoupling method, since the noise is killed right at the source. Also, the designer does not have to consider decoupling especially when cells or blocks from such a library are used.

The addition of such decoupling circuit elements does, however, consume the usually expensive silicon surface. If the decoupling capacitor is placed close to the noise source, the capacitor may be made smaller to a corresponding degree, since the decoupling will be more effective and smaller capacitors means less silicon surface is consumed.

The arrangement of the supply lines and ground connections is usually achieved by using metallization lines, which are broader than their corresponding signal lines. This is particularly true for high frequency IC-circuits. These supply lines are usually made at some metallization level during manufacturing, which layers are usually denoted with "m" plus a digit indicating the level, such as m2 (or m3 if available). Preferably, m2 or m3 is used to this end due to the higher conductivity of metallization layers higher up. The layer m1 and doped semiconductor layers are used for a local interconnection and for a definition of devices. The layers of these lower levels may be used in areas, which are completely covered by metallization in the m2 or m3 layers. Connections between the levels m1 and m2 and m2 and m3 respectively may then be achieved without using extra surface.

High quality capacitors having low values may be designed on one hand as a metal-metal capacitor, for instance, between m1 and m2; and on the other in a CMOS or a BiCMOS process making use of either a MOS structure (diffusion, polycrystalline silicon, m1 for connections) or as a reverse voltage pn junction (diffusion, m1 for connections).

SUMMARY OF THE DISCLOSURE

According to the present invention, each block or cell is provided with capacitors for decoupling purposes under the broad metal supply lines (e.g. Vcc GND) without requiring any extra silicon surface. These "buried" capacitors (Underground Capacitors) are designed under any broad conductor path in or on a chip made of semiconductor material and obtained through well known, established process techniques with the same process steps as in, for instance, the creating of conventional CMOS components or bipolar components, such as transistors.

According to the method of the present invention, a decoupling capacitor is created underneath a broad supply conductor on an integrated circuit chip utilizing the existing standard steps in the manufacturing process for the integrated circuit chip as follows:

applying a layer, of polysilicon, which is made conductive, on a thin layer of gate oxide on a $p^-$ substrate (resp. $n^-$ substrate), said polysilicon layer at the same time constituting a protective layer for the thin gate oxide and said polysilicon area being given an extension in a first direction of extension, which is greater than said underlying layer, which is constituted by said thin gate oxide layer, whereby at least one surface of gate oxide is formed and delimited in the second direction of extension by said conductive layer, e.g., of polysilicon and by a thick field oxide, said surface of gate oxide not being protected by said conductive layer, e.g., of polysilicon, creating a $p^+$doped (resp. $n^+$doped) island in said $p^-$substrate ($n^{31}$ substrate) by implanting said created surface of gate oxide, which is not protected by said conductive layer, applying an insulating layer, suitably by depositing an oxide, in which are created by masking and etching a first plurality of interconnection openings for interconnection to said formed $p^+$doped (resp. $n^+$doped) substrate island and a second plurality of interconnection openings to said conductive layer, e.g., of polysilicon at the ends of said conductive layer in said first direction of extension, said second plurality of interconnection openings being placed in an area, which does not cover underlying thin gate oxide, applying at a first metallization level m1 a first metallization area, which is connected to said $p^-$doped (resp. $n^+$doped) substrate island, as well as at least one second metallization area, which is connected to said conductive layer, e.g., of polysilicon through the second plurality of interconnection openings, whereby a high capacitance capacitor structure is created, said capacitor structure being, suitable for, for instance, decoupling to a positive voltage source, by additional connection to said two formed metallization areas at said first metallization level m1, which first metallization area and second metallization area each correspond to a respective capacitor terminal, said capacitor structure being connected through additional standard process steps by means of, for instance, a following metallization level m2 to the desired portion of said function block or integrated circuit.

The capacitor is thereby created by using the same techniques as are conventionally used for producing CMOS elements or bipolar elements on the chip and further on the chip placed under a broad metallization conductor for supply voltages or a ground connection, making any extra silicon surface superfluous.

The capacitor created hereby provides high capacitance with a high insulation voltage in relation to the surface through utilization of a thin oxide layer as an insulator in the capacitor structure whereby this is preferably achieved by a gate oxide layer of the magnitude of 200–300 Å, providing a structure, which, with the exception of the doping of the substrate island, is similar to that of a MOS transistor.

Further, according to the invention, the inherent resistance in the capacitor structure is thereby kept very low on one hand through a first metallized interconnection surface with a plurality of interconnection openings to the $p^+$doped (resp. $n^+$doped) substrate island and on the other hand through an extended second metallized interconnection surface with a plurality of interconnection openings to a first conductive layer, of polysilicon, said second surface of metallization for interconnection to said first conductive layer, of polysilicon not being located to the area containing thin gate oxide underneath the conductive layer, of polysilicon. Hereby optimally low resistances are provided in the capacitor structure, being essential in high frequency applications, particularly for areas of application of ultrahigh frequency (UHF) in order to obtain small time constants in decoupling through the capacitance of the capacitor and the RC network thus created through its inherent supply resistances.

Further, according to the method of the present invention, the decoupling capacitators in each construction block or standard cell are integrated in a cell library, increasing the decoupling effectivity for high frequency noise and reducing the set-up time for a desired function at construction and further improving the total circuit characteristics of the final circuit function.

Further, the method of the present invention permits, should an additional built-in attenuating resistance be needed in the decoupling capacitator, an increase of the connection resistor simply by integrating additional resistance or by diminishing the extended interconnection surface to the first conductive layer of polysilicon and the $p^+$doped (resp. $n^+$doped) substrate island respectively and thereby a correspondingly diminished number of interconnection openings.

The method according to the present invention further makes it possible also to utilize, for instance, bonding surfaces in order to create decoupling capacitators, provided that the layer underlying the bonding chip is given a thickness/strength, so that the decoupling capacitator created according to the present invention is capable of resisting the stresses which occur during the bonding process.

DESCRIPTION OF THE DRAWINGS

The invention will now be described as preferred embodiments by means of the attached drawings, which show.

DETAILED DESCRIPTION

Figure 1:
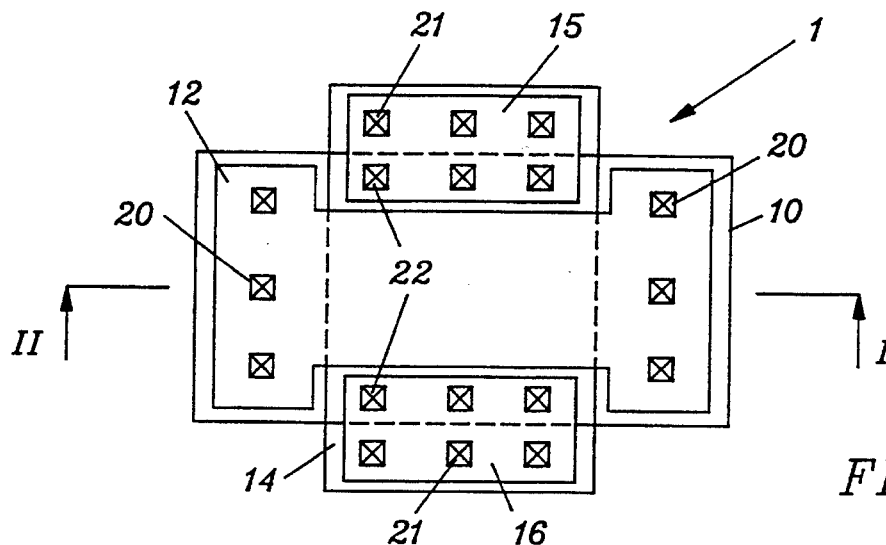
FIG. 1 illustrates a capacitor structure on a semiconductor substrate according to the present invention, seen from above.

Seen from above, FIG. 1 shows a semiconductor substrate with a capacitor structure, which is generally designated 1. Further, the capacitor structure is generally limited in relation to other substrate elements by a "LOCOS" mask (or, in the used process, also "MOAT") schematically indicated by the delimitation line designated 10 and defining the component area limited by a thick field oxide. Further, a layer 14 of a material made highly conductive, such as polysilicon, is provided. Three areas of metallization 12, 15 and 16, which are provided with interconnection openings 20, 21 and 22 respectively, are provided at the first metallization level m1 counting from the substrate.

Figure 2:
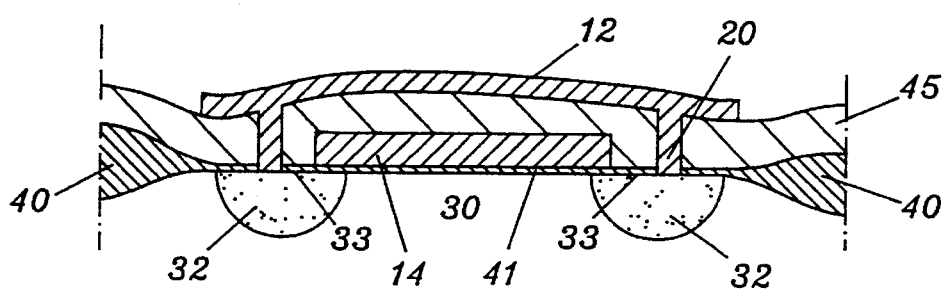
FIG. 2 illustrates a cut along the line II—II through the capacitor structure of FIG. 1.

FIG. 2 shows a cross-section of the capacitor structure of FIG. 1 in a plane, which is perpendicular to the plane in FIG. 1 along a cutting line II—II. Primarily, the cross-section view of FIG. 2 shows the $p^-$type (or $n^-$type) semiconductor substrate 30, in which surfaces 33 with implanted areas 32 of $p^+$type (resp. $n^+$type) are provided. Centrally located between the implanted conductive islands 32, a thin gate oxide layer 41 is found as an insulating layer between the substrate 30 and a conductive layer 14, of, for example, polysilicon. In the present embodiment, the thin gate oxide layer 41 has a thickness of 200–300 Å, while the conductive layer, of polysilicon, has a thickness of 2500–5000 Å. In the present embodiment, the distance between the implanted islands 32 is of the magnitude down to 0.5 μm, and preferably 0.8 μm. The capacitor structure is limited from the components integrated on the substrate 30, according to conventional techniques, by a thick field oxide 40 constituting the so called LOCOS-mask, with a thickness in the present embodiment of 5000–6000 Å. Further deposed on the structure is an oxide layer 45, in which interconnection openings 20 have been etched to interconnect to the created implanted conductive islands 32. A metallization layer (constituting the metallization area 12 in FIG. 1), which is interconnected through the interconnection openings 20 to the conductive surfaces 33, is seen above the oxide layer 45 at the metallization level m1. The conductive layer 14, of polysilicon is connected in a corresponding way through interconnection openings 21 with the metallization areas 15 and 16 respectively at the metallization level m1. These interconnection openings 21 are placed in the longitudinal direction of the conductive layer 14 (FIG. 1) in such a manner, that they are located the area under which the thin gate oxide layer 41 is disposed, in order to guarantee that the thin layer remains undamaged as interconnection openings are created in the areas 15 and 16 at the metallization level m1 at interconnection of the conductive layer.

As FIG. 1 further shows, the metallization area 12 has the shape of an "H", where the stems of the "H" are interconnected through the interconnection openings 20 to the implanted conductive islands 32. Here, the metallization areas 15 and 16, respectively, are located so as to enter free surface areas created by the "H" shape of the metallization area 12, and the metallization areas 15, 16 present an additional number of interconnection routes 22 for further interconnection to, for instance, a metallization layer at, for instance, metallization level m2 for the connection of the capacitor created. The interconnection routes 22 are here preferably located inside the thin gate oxide layer, since additional protection is provided at this location in the form of the oxide layer 45 over the conductive layer 14 and the thin gate oxide 41. This implies making maximal use of the silicon surface. In the present embodiment, the entire device is placed underneath, for instance, a broad voltage supply line or ground connection or, where appropriate, also underneath a bonding pad.

A capacitor having a capacitance 10–20 times higher than that of a capacitor manufactured according to prior art, is achieved due to the thin gate oxide layer. The capacitance is of about the same magnitude as in a case with p/n junction biased in the reverse direction, but offers superior breakdown characteristics, i.e., high voltage immunity. The construction of the capacitor of the present invention gives a structure, which is essentially the same as that of a CMOS component in form of a transistor, with the one difference, that the implanted conductive substrate island 32 possesses another property. Use of a $p^+$type implantation used in a $p^-$substrate provides a capacitor suitable for decoupling positive voltages to ground, while, in a corresponding way, the $n^+$type implantation in an $n^-$type substrate portion results in a capacitor for decoupling a negative voltage to ground.

Figure 3:
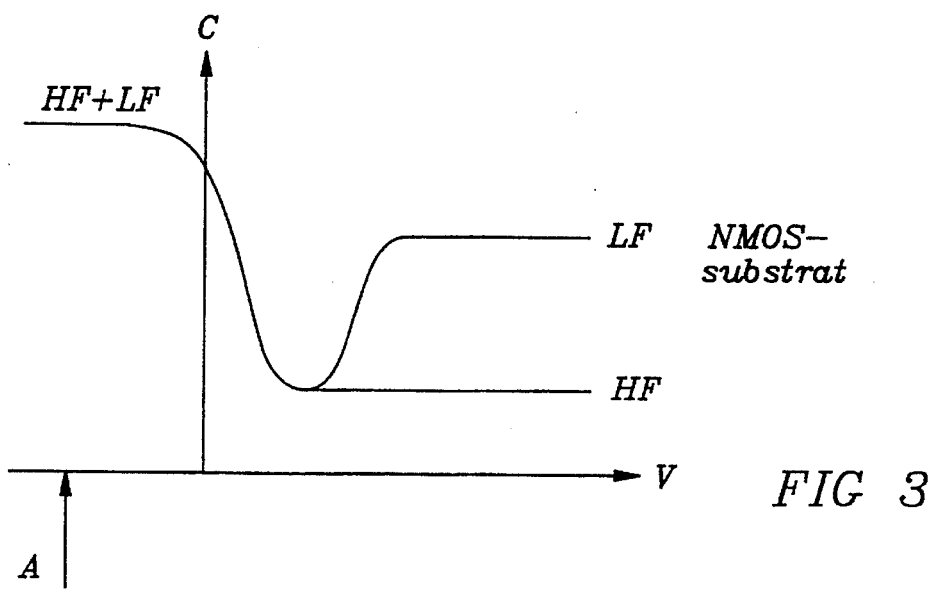
FIG. 3 illustrates a diagram showing voltage/capacitance characteristics of a capacitor having a MOS structure according to FIG. 2, the substrate being tied to ground.

FIG. 3 shows a diagram of the capacitance as a function of the voltage across the thin gate oxide layer at a NMOS structure, i.e., a $p^-$substrate. (The corresponding signal across the gate electrode, wherein the substrate being grounded). This shows that the capacitance will vary depending on whether the voltage supplied across the thin gate oxide layer is a positive HF-signal or a LF signal, while an equal and constant capacitance will be obtained, both for HF and LF, the operating point being placed at the negative side at the arrow A. In other words, the capacitor is thus also suitable for decoupling when being reversed bias. In a corresponding way, in a PMOS structure, i.e., a $n^-$substrate, a capacitor, which should be positively biased, thus suitable for decoupling a positive voltage, will be provided.

The manufacturing process basically takes place using known techniques, whereby initially a gate oxide, for instance, of a thickness of 5000–6000 Å, is created, through a so called LOCOS process outside the area intended to produce the capacitor and the implanted substrate contacts. Then a conductive layer is applied through etching with a conventional photoresist mask (or an alternative masking technique) so as to not entirely cover the gate oxide in the area 32, after which implantation for creating a $p^+$region (resp. $n^+$region) in the $p^-$substrate (resp. $n^-$substrate) can take place in the area(s) 32.

Then the oxide layer 45 is created and interconnection openings 20 and 21 are etched by means of conventional techniques, after which the metallization areas 12, 15 and 16 are created in a conventional manner at the metallization level m1. This is followed by the application of another insulation layer 45, which is fitted with interconnection openings 20 and 21 for the interconnection to the other components of the capacitor created on the substrate via, the next metallization level in a conventional manner. In the final metallization of supply lines or bonding chips, for instance at the metallization level m3, these are placed over eventual created capacitors according to the present invention.

It will be appreciated by those or ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embodied therein.

We claim:

1. A method for construction of an integrated capacitor having a capacitance in an integrated function block or an integrated circuit, which utilizes unoccupied silicon surface underlying supply lines, ground connections or a bonding pad, and comprising the steps of:

applying a conductive layer on a thin layer of gate oxide on a $p^-$substrate, said conductive layer at the same time constituting a protective layer for the thin gate layer of said oxide and said conductive layer extending in a first direction, which extends beyond the underlying thin layer of said gate oxide, whereby at least one surface of the thin layer of said gate oxide is formed and delimited in a second direction opposite to said first direction by said conductive layer and by a thick layer of field oxide, and at least the one surface of the thin layer of said gate oxide is not protected by said conductive layer, creating $p^+$doped islands in said $p^-$substrate by implanting in the surface of the thin layer of said gate oxide, which is not protected by said conductive layer, forming an insulating layer over exposed surfaces of the thin layer of said gate oxide, said conductive layer and the thick layer of said field oxide, forming a first plurality of interconnection openings for interconnection to said $p^+$doped islands and a second plurality of interconnection openings for interconnection to said conductive layer at ends of said conductive layer in said first direction, said second plurality of interconnection openings being placed in an area which does not have the thin layer of said gate oxide underneath, and forming a plurality of metallization areas at a first metallization level, said metallization areas including a first metallization area, which is connected to said p⁺doped islands through the first plurality of interconnection openings, and at least one second metallization area, which is connected to said conductive layer through said second plurality of interconnection openings, whereby a capacitor structure of a capacitance is created, said capacitor structure decouples to a positive voltage source by additional connection to said first and second metallization areas at said first metallization level, wherein said first and second metallization areas each correspond to a respective capacitor connection, said capacitor structure being connected to portions of the function block or the integrated circuit by a second metallization level formed over said first metallization level.

2. The method according to claim 1, wherein the integrated capacitor created thereby offers a high capacitance through the utilization of the thin layer of said gate oxide as an insulator in the capacitor structure for withstanding insulating voltage at the surface for obtaining the high capacitance and whereby this is preferably achieved with the thin layer of said gate oxide being in the magnitude of 200–300 Å, for providing a structure, which, with the exception of the doping of the p⁺doped islands, is similar to that of a MOS transistor.

3. The method according to claim 2, wherein the integrated capacitor comprises a capacitance which minimizes the contribution of attenuating resistance, due to the fact that interconnection is achieved by said first plurality of interconnection openings to said p⁺islands and by said second plurality of interconnection openings to said conductive layer and thereby the integrated capacitor has a reactive portion in relation to its resistive portion for decoupling at frequencies corresponding to the high capacitance operation.

4. The method according to claim 3, wherein said first metallization area, which is connected to at least one of said p⁺doped islands, covers areas of the capacitor structure, except for the areas associated with the thick layer of said field oxide and at least the one second metallization area.

5. The method according to claim 4, wherein further interconnection of said second metallization area through a third plurality of interconnection routes to levels of metallization disposed above said first metallization level is arranged over areas with the thin layer of said gate oxide underneath.

6. A method for construction of an integrated capacitor having a capacitance in an integrated function block or an integrated circuit, wherein unoccupied silicon surface underlying supply lines, ground connections, or a bonding surface is utilized, and comprising the process steps of applying a conductive layer on a thin layer of gate oxide on a n⁻substrate, said conductive layer at the same time constituting a protective layer for the thin layer of said gate oxide and said conductive layer extending in a first direction, which extends beyond the underlying thin layer of said gate oxide, whereby at least one surface of the thin layer of said gate oxide is formed and delimited in the second direction opposite to said first direction by said conductive layer and by a thick layer of field oxide, and at least the one surface of the thin layer of said gate oxide is not protected by said conductive layer, creating n⁺doped islands in said n⁻substrate by implanting dopants in the surface of the thin layer of said gate oxide, which is not protected by said conductive layer, forming an insulating layer over exposed surfaces of the thin layer of said gate oxide, said conductive layer and the thick layer of said field oxide, forming a first plurality of interconnection openings for interconnection to said n⁺doped islands and a second plurality of interconnection openings for interconnection to said conductive layer at ends of said conductive layer in said first direction, said second plurality of interconnection openings being placed in an area which does not have the thin layer of said gate oxide underneath, forming a plurality of metallization areas at a first metallization level, said metallization areas including a first metallization area, which is connected to said n⁺doped islands through the first plurality of interconnection openings, and at least one second metallization area which is connected to said conductive layer through said second plurality of interconnection openings, whereby a capacitor structure of capacitance is created, said capacitor structure decouples to a negative voltage source by additional connection to said first and second metallization areas at said first metallization level wherein the first metallization area and the second metallization area each correspond to a respective capacitor connection, said capacitor structure being connected to portions of the function block or the integrated circuit by a second metallization level formed over said first metallization level.

7. The method according to claim 6, wherein the MOS capacitor created thereby offers a high capacitance through the utilization of the thin layer of said gate oxide as an insulator in the capacitor structure for withstanding insulation voltages at the surface for obtaining the high capacitance and whereby this is preferably achieved with the thin layer of said gate oxide being in the magnitude of 200–300 Å, for providing a structure, which, with the exception of the doping of the n⁺doped islands, is similar to that of a MOS transistor.

8. The method according to claim 7, wherein the integrated capacitor comprises a capacitance which minimizes the contribution of attenuating resistance, due to the fact that interconnection is achieved by said first plurality of interconnection openings to said n⁺doped islands and by said second plurality of interconnection openings to said conductive layer and thereby the integrated capacitor has a reactive portion in relation to its resistive portion for decoupling at frequencies corresponding to the high capacitance operation.

9. The method according to claim 8, wherein further interconnection of said second metallization area through a third plurality of interconnection routes to levels of metallization disposed above said first metallization level is arranged over areas with the thin layer of said gate oxide underneath.

10. The method according to claim 9, wherein said first metallization area, which is connected to at least one of the n⁺doped islands, covers areas of the capacitor structure, except for the areas associated with the thick layer of said field oxide and at least the one second metallization area.

11. The method according to claim 10, wherein further interconnection of said second metallization area through a third plurality of interconnection routes to levels of metallization disposed above said first metallization level is arranged over areas with the thin layer of said gate oxide underneath.

12. The method according to claim 1, wherein said first metallization area, which is connected to at least one of the p$^+$doped islands, covers the capacitor structure, except for areas associated with the thick layer of said field oxide and at least the one second metallization area.

13. The method according to claim 1, wherein said conductive layer comprises polysilicon.

14. The method according to claim 6, wherein said conductive layer comprises polysilicon.

15. The method according to claim 1, wherein said step of forming said insulating layer comprises depositing an oxide layer.

16. The method according to claim 6, wherein said step of forming said insulating layer comprises depositing an oxide layer.

17. The method according to claim 15, wherein said insulating layer is created by masking and etching.

18. The method according to claim 16, wherein said insulating layer is crated by masking and etching.

19. The method according to claim 1, wherein the integrated capacitor comprises a MOS capacitor structure.

20. The method according to claim 6, wherein the integrated capacitor comprises a MOS capacitor structure.

* * * * *